United States Patent
Sood et al.

(10) Patent No.: US 8,222,943 B2
(45) Date of Patent: Jul. 17, 2012

(54) MASTER-SLAVE FLIP-FLOP WITH TIMING ERROR CORRECTION

(75) Inventors: Santosh Sood, New Delhi (IN); Mukesh Bansal, Cheeka (IN)

(73) Assignee: Freescale Semiconductor, Inc., Austin, TX (US)

(*) Notice: Subject to any disclaimer, the term of this patent is extended or adjusted under 35 U.S.C. 154(b) by 86 days.

(21) Appl. No.: 12/888,367

(22) Filed: Sep. 22, 2010

(65) Prior Publication Data

US 2012/0068749 A1    Mar. 22, 2012

(51) Int. Cl.
*H03K 3/356* (2006.01)
(52) U.S. Cl. ........................................... 327/203
(58) Field of Classification Search .................. None
See application file for complete search history.

(56) References Cited

U.S. PATENT DOCUMENTS 7,391,250 B1 * 6/2008 Chuang .................. 327/211
7,409,631 B2    8/2008 Tschanz

* cited by examiner

*Primary Examiner* — Lincoln Donovan
*Assistant Examiner* — Sibin Chen
(74) *Attorney, Agent, or Firm* — Charles Bergere

(57) ABSTRACT

A digital logic circuit includes a logic element for providing a data signal, a clock for providing a clock signal and a master-slave flip-flop. The master-slave flip-flop includes a master latch for storing data on a master latch input at a first active edge of the clock signal and a slave latch for storing data on an output of the master latch at a second active edge of the clock signal following the first active edge. A timing error detector asserts an error signal in response to a change in the data signal during a detection period following the first active edge of the clock signal. A timing correction module selectively increases a propagation delay of the data signal from the logic element to the master latch input in response to the error signal.

16 Claims, 4 Drawing Sheets

MASTER-SLAVE FLIP-FLOP WITH TIMING ERROR CORRECTION

BACKGROUND OF THE INVENTION

The present invention is directed to a digital logic circuit including a master-slave flip-flop with timing error correction, and to a method of operating a master-slave flip-flop with timing error correction.

Digital logic circuits such as data processors include sets of circuit elements forming logic "pipelines" through which digital signals propagate and are processed. The propagation of the digital signals from the output of each circuit element to the input of the following circuit element may be synchronized using clock signals. Signal propagation delays may occur either statically, due to manufacturing tolerances, or dynamically, due to variation in operating conditions such as supply voltage or temperature or noise, for example. If such delays cause the signal input to occur outside the correct clock phase, the timing error may cause malfunction of the digital logic circuit.

Master-slave flip-flops are widely used as circuit elements of digital logic circuits. Typically a master-slave flip-flop comprises two series connected gated latches driven by a two-phase clock signal. The master latch stores the value of the input signal at the trailing edge of a first phase of the clock signal, which is the active clock edge for the master latch. The slave latch stores the value of the output signal from the master latch at the trailing edge of the following, opposite phase of the clock signal, which is the active clock edge for the slave latch.

Timing errors in flip-flops may appear as meta-stability, when a data input changes too close to the active edge of the clock pulse. The result is that the output may become unpredictable, taking many times longer than normal to settle to its correct state, or even oscillating several times before settling. This can corrupt the data being processed. The meta-stability in a master-slave flip-flop can be reduced by ensuring that the data input to the master latch is held valid and constant for specified periods before and after the active edge of the clock pulse, called the setup time and the hold time respectively.

It is possible to reduce the likelihood of set-up time violations by detecting actual or potential timing errors and reducing the clock frequency. However, this may not be effective to reduce the likelihood of hold time violations. Thus, it would be advantageous to have a master-slave flip-flop that detects potential setup and hold time violations and corrects therefor.

BRIEF DESCRIPTION OF THE DRAWINGS

The present invention is illustrated by way of example and is not limited by the embodiments shown in the accompanying figures, in which like references indicate similar elements. Elements in the Figs. are illustrated for simplicity and clarity and have not necessarily been drawn to scale.

DETAILED DESCRIPTION OF THE INVENTION

Figure 1:
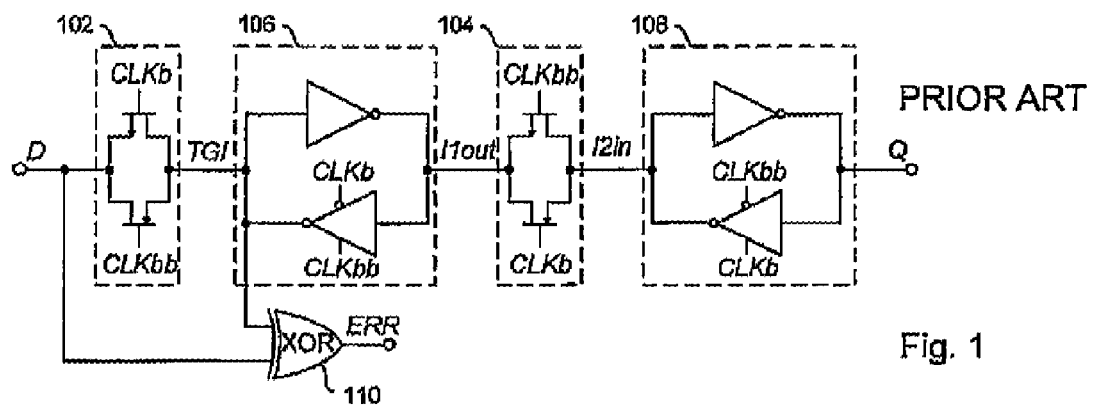
FIG. 1 is a schematic circuit diagram of a conventional master-slave flip-flop with timing error correction.

FIG. 1 shows a conventional master-slave flip-flop with timing error detection. The master-slave flip-flop includes a transmission gate 102 in the master stage and a transmission gate 104 in the slave stage. The master stage also includes a master latch 106 and the slave stage includes a slave latch 108. A clock signal CLK is provided to the flip-flop as well as inverted and doubly inverted clock signals CLKb and CLKbb.

The master transmission gate 102 receives an input data signal D and, when enabled, passes a signal TGI to the master latch 106, which produces a signal I1out. The slave transmission gate 104 receives the signal I1out from the master stage and, when enabled, passes a signal I2in to the slave latch 108, which produces an output signal Q. The master transmission gate 102 is enabled (on) when the clock CLKbb is at a de-asserted phase and is disabled (off) when the clock CLKbb is asserted. The slave transmission gate 104 is enabled when the clock CLKbb is at an asserted phase and is disabled (off) during the de-asserted phase of the clock CLKbb. The master latch 106 latches its input signal TGI and output signal I1out at a first active clock edge when the clock CLKbb changes from a de-asserted phase to an asserted phase. The slave latch 108 latches its input signal I2in and output signal Q at a second, following active clock edge when the clock CLKbb changes from an asserted phase to a de-asserted phase.

The flip-flop shown in FIG. 1 also includes an exclusive OR ('XOR') gate 110, which generates an error signal ERR when the output signal TGI from the master transmission gate 102 is different from the input signal D. This condition occurs when the input signal D changes after the clock signal CLKbb, has transitioned from de-asserted to asserted, but before the clock signal CLKbb has transitioned back to the de-asserted phase. In other words, if the data input signal D changes while the clock signal CLKbb is asserted and the master transmission gate 102 is OFF, the error signal ERR is produced by the XOR gate 110.

The effectiveness of using the error signal ERR with a view to reducing the likelihood of timing errors is limited. This conventional flip-flop detects changes in the input signal D when the clock signal CLKbb has already changed from a de-asserted to an asserted state. Thus, it generates the error signal ERR when there is a setup window violation in the data path, and lowers the clock frequency to mitigate any setup failure issue. The error signal ERR is generated by continuous comparison of the input signal D and the output signal TGI from the master transmission gate 102 and has no correlation to the local transitions of the clock signals CLKb and CLKbb. The varying width error pulses generated have to be further interpreted in a separate logic block to take any corrective action. There also is a constraint on the design that all the minimum path delays between the master and slave latches 106 and 108 have to be at least a half clock period long to avoid any dummy failures due to the input signal D changing after the clock signal CLKbb has transitioned from asserted to de-asserted state.

Figure 2:
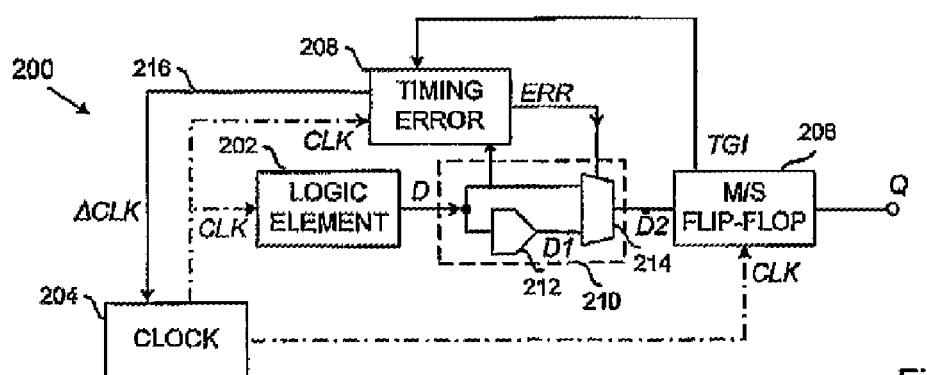
FIG. 2 is a schematic block diagram of a digital logic circuit including a master-slave flip-flop with timing error correction in accordance with one embodiment of the present invention.

FIG. 2 is a schematic block diagram of a digital logic circuit 200 including a master-slave flip-flop with timing error correction in accordance with an embodiment of the present invention. The circuit 200 uses signals that are positive or high when asserted and zero or low when de-asserted. It will be appreciated that an equivalent circuit may be designed to use signals of the opposite polarity. The digital logic circuit 200 may be used in conjunction with many other types of circuits. For example, the circuit 200 may form part of a data processor.

The digital logic circuit 200 includes a logic element 202 for providing a data input signal D, a clock 204 for providing a clock signal CLK and a master-slave flip-flop 206. The master-slave flip-flop 206 includes a master latch for storing data TGI on a master latch input at a first active edge of the clock signal CLK and a slave latch for storing data on an output of the master latch at a second active edge of the clock signal CLK following the first active edge. The digital logic circuit 200 also includes a timing error detector module 208 for asserting an error signal ERR in response to a change in the data signal D during a detection period following the first active edge of the clock signal, and a timing correction module 210 for selectively increasing a propagation delay of the data signal from the logic element 202 to the master latch input in response to the error signal ERR.

In this example of an embodiment of the invention, the timing correction module 210 includes a signal delay element 212 through which the data signal D from the logic element 202 passes, as a delayed data signal D1, delayed by a time Δt, and both the data signals D and D1 are applied to the inputs of a multiplexer 214 controlled by the error signal ERR. The direct data signal D or the delayed data signal D1 is selected by the multiplexer 214 as a function of the error signal ERR and the data output signal D2 is applied to the master-slave flip-flop 206. The detection period following the first active edge of the clock signal corresponds with a hold window of the master latch.

The introduction of the delay in the data signal D2 may convert a hold window violation into a setup window violation. Accordingly, the timing error detector module 208 applies a signal ΔCLK over a line 216 to reduce progressively the frequency of the clock signal if the error signal ERR is asserted, to compensate for the additional delay when the data signal D2 corresponds to the delayed data signal D1. In addition, the timing error detector module 208 applies a signal ΔCLK over the line 216 to reduce the frequency of the clock signal if the timing error corresponds to a violation of the setup window preceding the first active edge of the clock signal, when the error signal ERR is not asserted, without increasing the propagation delay of the data signal D2 from the logic element 202 to the master latch input. The effect of such a reduction in clock frequency is to delay the active edge of the clock signal relative to the data signal D, so that the likelihood of a setup window violation is reduced.

It will be appreciated that various suitable methods are available for detecting a setup window violation. For example, the data pipeline may include a scan path having a timing error detection flip-flop, or the functional data path may include a debugger or core in which the timing error manifests as an exception. The signal ΔCLK over the line 216 may differentiate between hold window violations and setup window violations, so that the clock frequency of the clock signal reduces progressively and incrementally in the case of a hold window violation but reduces in one step to the minimum specified clock frequency in the case of a setup window violation.

Figure 3:
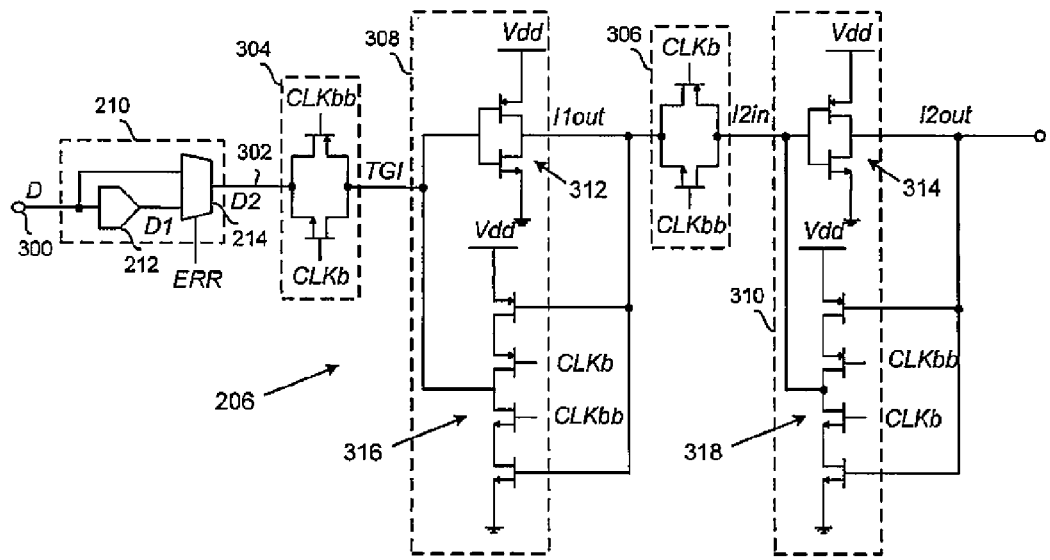
FIG. 3 is a simplified circuit diagram of an example of the master-slave flip-flop of FIG. 2.

FIG. 3 illustrates an example of the master-slave flip-flop 206 and the timing correction module 210 of FIG. 2 in more detail. The timing correction module 210 comprises an input terminal 300 that receives the data input signal D from the logic element 202. The input terminal 300 is connected directly to one input of the multiplexer 214 and is connected through the delay element 212 to apply the delayed data input signal D1 to another input of the multiplexer 214. The multiplexer 214 receives the error signal ERR from the timing error detector module 208 as control input. The multiplexer 214 is connected to apply the multiplexer output signal D2 to an input 302 of the master-slave flip-flop 206. When the error signal ERR is asserted, the multiplexer output signal D2 applied to the input 302 of the master-slave flip-flop 206 corresponds to the delayed data input signal D1 and when the error signal ERR is de-asserted, the multiplexer output signal D2 applied to the input 302 of the master-slave flip-flop 206 corresponds to the non-delayed data input signal D.

The master-slave flip-flop 206 includes a master transmission gate 304 and a slave transmission gate 306. The flip-flop 206 also includes a master latch 308 and a slave latch 310. The clock signal CLK is provided for the master-slave flip-flop 206 as well as inverted and doubly inverted clock signals CLKb and CLKbb.

In the example illustrated, the master and slave transmission gates 304 and 306 comprise respective anti-parallel pairs of n-type and p-type metal-oxide semiconductor field effect transistors ('MOSFETS') connected in series in the signal path, the MOSFETS of the master transmission gate 304 conducting only during one clock phase and the MOSFETS of the slave transmission gate 306 conducting only during the opposite clock phase. The master and slave latches 308 and 310 may include respective first inverters 312 and 314 comprising respective stacked pairs of n-type and p-type MOSFETS and respective second, feedback inverters 316 and 318 comprising respective stacked pairs of n-type and p-type MOSFETs clocked by respective further pairs of n-type and p-type MOSFETS. However, other suitable configurations may be used for the transmission gates 304 and 306 and the master and slave latches 308 and 310.

In operation, the master transmission gate 304 receives the multiplexer output data signal D2 and, when enabled, passes a signal TGI to the master latch 308, which produces a signal I1out. The slave transmission gate 306 receives the signal I1out from the master latch 308 and, when enabled, passes a signal I2in to the slave latch 310, which produces an output signal I2out. The master transmission gate 304 is enabled when the clock CLKbb is at a de-asserted phase and is OFF during its asserted phase. The slave transmission gate 306 is enabled when the inverted clock CLKb is at a de-asserted phase and is OFF during its asserted phase. The feedback inverter 316 of the master latch 308 is de-activated when the clock CLKbb is at a de-asserted phase. At a first active clock edge, when the clock CLKbb changes from de-asserted phase to asserted phase, the feedback inverter 316 is activated to latch the input signal TGI and the output signal I1out. At a second, following active clock edge, when the clock CLKbb goes from an asserted phase to a de-asserted phase, the feedback inverter 318 of the slave latch 310 latches the input signal I2in and output signal I2out.

Figure 4:
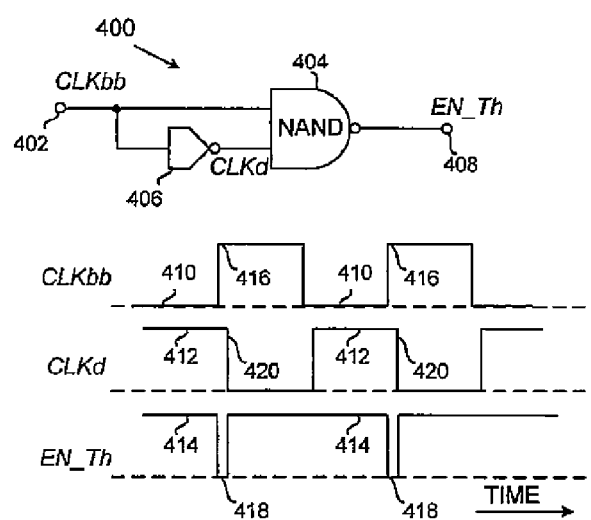
FIG. 4 is a schematic diagram of a timing signal generator and a timing chart for the master-slave flip-flop of FIG. 3.
Figure 5:
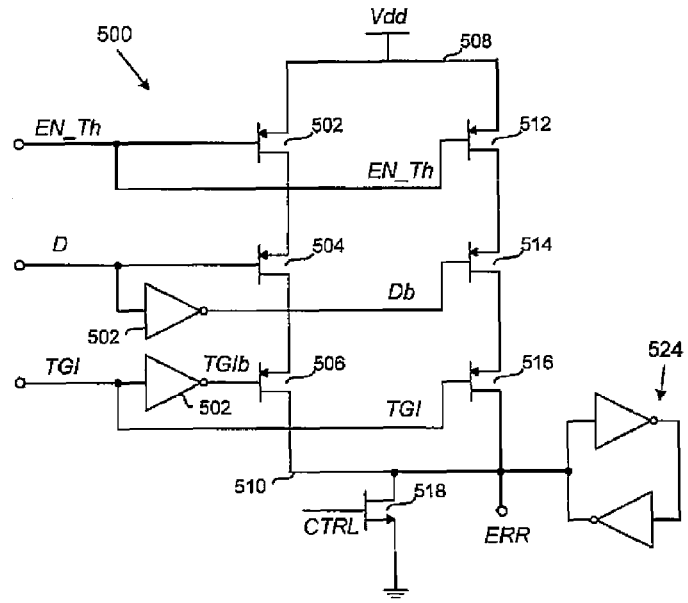
FIG. 5 is a schematic circuit diagram of a hold violation detector for the master-slave flip-flop of FIG. 3.

FIGS. 4 and 5 illustrate an example of the timing error detector module 208. FIG. 4 shows an edge detector 400 for asserting a timing signal EN_Th whose duration defines the detection periods following the first active edges of the clock signal CLKbb, that is to say the active edges of the clock signal CLKbb for the master transmission gate 304. The assertion of the timing signal EN_Th activates an error signal generator 500 shown in FIG. 5.

The edge detector 400 receives the clock signal CLKbb on an input terminal 402. The input terminal 402 is connected to one input of a NAND gate 404, another input of which is connected to an output of a delay and inverter element 406, which is connected to receive the clock signal CLKbb from the input terminal 402 and produces a delayed, inverted clock signal CLKd. An output 408 of the NAND gate 404 provides the timing signal EN_Th.

In operation, during the de-asserted phase 410 of the clock signal CLKbb, the output CLKd of the delay and inverter element 406 is asserted at 412, and the timing signal EN_Th at the output 408 of the NAND gate 404 is asserted at 414. When the clock signal CLKbb is asserted at 416, during the detection period following the active edge of the clock signal CLKbb the inverted clock signal CLKd initially remains temporarily asserted because of the delay introduced by the element 406, so that the timing signal EN_Th at the output of the NAND gate 404 is de-asserted at 418. After the delay defined by the element 406, which defines the detection period following the first active edge of the clock signal CLK, the inverted clock signal CLKd is de-asserted at 420, and the timing signal EN_Th at the output of the NAND gate 404 is asserted again until the clock signal CLKbb is next de-asserted and then re-asserted.

The error signal generator 500 comprises two stacks of p-type MOSFETs. A first stack comprises MOSFETs 502, 504 and 506 connected with their source-drain paths in series between a power supply rail 508 and a node 510. The second stack comprises MOSFETs 512, 514 and 516 connected with their source-drain paths in series between the power supply rail 508 and the node 510, in parallel with the first stack. An n-type MOSFET has its drain connected to the node 510 and its source connected to ground. The timing signal EN_Th from the edge detector 400 is applied to the gates of both the MOSFETs 502 and 512. The data signal D from the logic element 202 is applied directly to the gate of the MOSFET 504 and through an inverter 520 to the gate of the MOSFET 514. The signal TGI from the master transmission gate 304 is applied through an inverter 522 to the gate of the MOSFET 506 and directly to the gate of the MOSFET 516. A control signal CTRL is applied to the gate of the MOSFET 518. A latch 524 comprising back-to-back inverters connected to the node 510 latches the error signal ERR on the node 510 until a change of state of the timing signal EN_Th occurs when the edge detector 500 is next activated.

In operation, at the start of a detection cycle, the control signal CTRL is asserted, the MOSFET 518 is ON and clamps the node 510 to ground, de-asserting the error signal ERR. The error signal generator 500 is then activated by de-asserting the control signal CTRL, turning the MOSFET 518 OFF and releasing the voltage of the node 510. Then, while the timing signal EN_Th from the edge detector 400 is asserted, the MOSFETs 502 and 512 are turned OFF, preventing current flowing to the node 510, which is maintained in its previous state by the latch 524, regardless of changes in the data signal D and the signal TGI.

When the error signal generator 500 is activated, it can change state during the detection period following the first active edge of the clock signal CLK when the timing signal EN_Th is de-asserted, enabling the MOSFETs 502 and 512 to turn ON. The error signal generator 500 then acts as an exclusive OR ('XOR') gate for the data signal D and the signal TGI. If the data signal D from the logic element 202 and the signal TGI from the master transmission gate 304 are both asserted or both de-asserted, one of the MOSFETs 504, 506, 514 and 516 in each of the stacks of MOSFETs of the edge detector 500 is turned OFF, so that the error signal ERR at the node 510 is left de-asserted unless a previous timing error has already been detected and latched by the latch 524 since the start of the same detection cycle.

If the data signal D and the signal TGI are different during the detection period following the first active edge of the clock signal CLK when the timing signal EN_Th is de-asserted, either the pair of MOSFETs 504 and 506 in the first stack are simultaneously turned ON, or the pair of MOSFETs 514 and 516 in the second stack are simultaneously turned ON. In this case, current flows from the rail 508 either through the first stack of MOSFETs 502, 504 and 506, or through the second stack of MOSFETs 512, 514 and 516 to assert the error signal ERR at the node 510. Once asserted, the error signal ERR is latched by the latch 524 until reset by assertion of the control signal CTRL.

Figure 6:
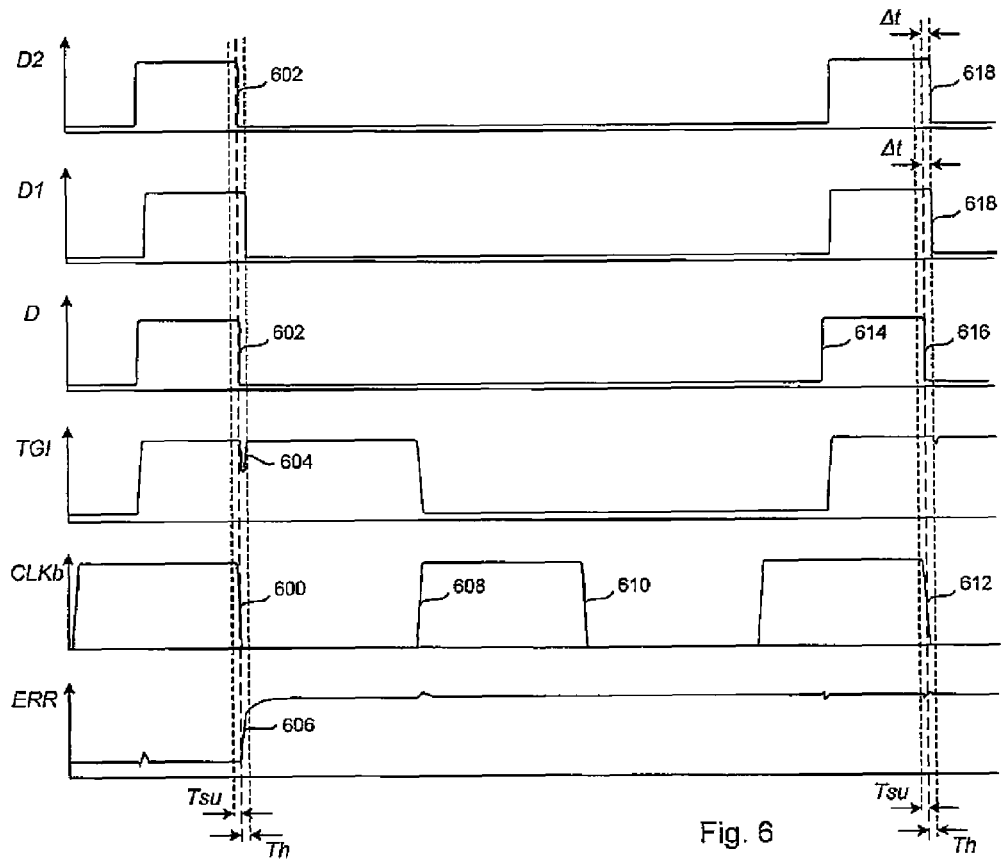
FIG. 6 is a timing chart of signals appearing in operation of the master-slave flip-flop of FIG. 3 and the hold violation detector of FIG. 5.

FIG. 6 shows an example of the timing of signals appearing in the operation of the circuits of FIGS. 3, 4 and 5. The active clock edge for the master latch 308 is shown at 600 in the inverted clock signal CLKb. The set-up time window Tsu and the hold time window Th are shown in dotted lines on each side of the active edge 600.

The operation is illustrated first with the multiplexer 214 selecting the direct data signal D from the logic element 202 as multiplexer output signal D2. The data signals D and D2 are asserted during the clock phase preceding the active edge 600, including the set-up window Tsu but are de-asserted at 602 immediately after the active edge 600, changing during the hold window Th. This hold time violation causes meta-stability in the master latch 308, shown at 604. Such meta-stability may cause an error in the data stored by the slave latch 310 and transmitted for further processing. However, in the case illustrated, the signal TGI passed by the master transmission gate 304 corresponds correctly in fact to the value of the data signals D and D2 during the previous clock phase even after the active clock edge 600. The hold time violation is detected by the error detector module 208, which asserts and latches the error signal ERR at 606.

At the leading edge 608 of the following clock cycle, the signal TGI passed by the master transmission gate 304 is de-asserted to correspond with the current value of the data signals D and D2. At the next active edge 610 of the clock signal CLKb, the data signal D2 and the signal TGI passed by the master transmission gate 304 are of the same value and remain unchanged.

The effect of assertion of the error signal ERR is seen at the third clock cycle illustrated. During the clock phase preceding the third active edge 612, the data signal D is shown as being asserted at 614 and then being de-asserted at 616 immediately after the active edge 600, changing during the hold window Th. However, since the error signal ERR is now asserted, the multiplexer 214 selects the delayed data signal D1 from the logic element 202 through the delay element 212 as multiplexer output signal D2. The delay introduced by the delay element 212 is arranged to be equal to or slightly greater than the width of the hold window Th. Accordingly, the de-assertion edges 618 of the delayed data signals D1 and D2, corresponding to the de-assertion edge 616 of the data signal D, occur after the hold window Th, reducing substantially the risk of meta-stability.

Figure 7:
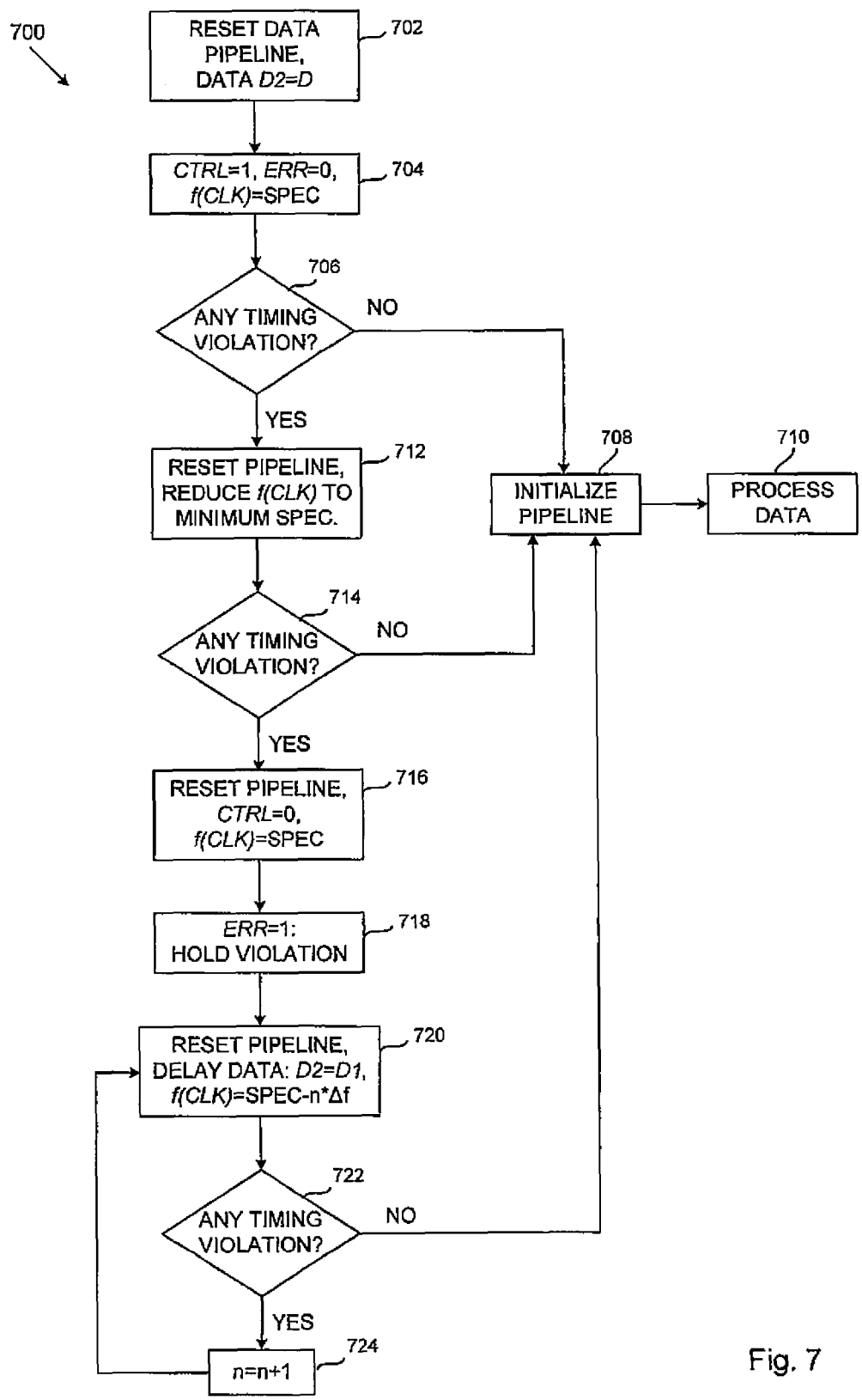
FIG. 7 is a flow chart of timing error detection and correction in a digital logic circuit including a master-slave flip-flop in accordance with one embodiment of the invention.

FIG. 7 is a flow chart of an example of a method 700 of detecting and correcting timing errors in accordance with an embodiment of the present invention. The method is applicable to a digital logic circuit, such as the digital logic circuit 200, including a logic element 202 providing a data signal D, a clock 204 providing a clock signal CLK, a master-slave flip-flop 206 comprising a master latch for storing data on a master latch input at a first active edge of the clock signal CLK and a slave latch for storing data on an output of the master latch at a second active edge of the clock signal CLK following the first active edge. The method 700 comprises asserting an error signal ERR in response to a change in the data signal D during a detection period Th following the first active edge of the clock signal, and selectively increasing a propagation delay of the data signal D2 from the logic element 202 to the master latch input in response to the error signal ERR.

The method 700, as applied by way of example to the edge detector 400 and the error signal generator 500, begins at the start of a detection cycle at 702 by resetting the data pipeline including the logic element 202 and the multiplexer 214 selects the direct data signal D from the logic element 202 as multiplexer output signal D2. At 704, the control signal CTRL is asserted, which de-asserts the error signal ERR, and the clock frequency f(CLK) is set to its nominal specification value. At 706, a decision is taken whether any timing violation has occurred. If not, the data pipeline including the logic element 202 is initialized to transmit data at 708 and the data is processed at 710.

If at 706 there is a timing violation, it is assumed to be a set-up time violation, at least initially, and at 712 the data pipeline is reset and the frequency f(CLK) of the clock signal CLK is reduced to the minimum value compliant with the specification. At 714, a decision is taken whether a timing violation still occurs. If not, the data pipeline including the logic element 202 is initialized to transmit data at 708 and the data is processed at 710.

If at 714 there is still a timing violation, it is now apparently a hold time violation, not a set-up time violation. The data pipeline is reset, the error signal generator 500 is activated by de-asserting the control signal CTRL and the clock frequency f(CLK) is reset to its nominal specification value at 716. At 718, the error signal ERR asserts, indicating a hold timing violation.

At 720, when the error signal ERR has been asserted, indicating a hold timing violation, the multiplexer 214 selects the delayed data signal D1 from the logic element 202 as multiplexer output signal D2 and the clock frequency is set to its nominal specification value SPEC. At 722, a decision is taken whether a timing violation still occurs. If not, the pipeline including the logic element 202 is initialized to transmit data at 708 and the data is processed at 710. If a timing violation still occurs at 722, it is apparently now due to a setup violation caused by the delay of the data signal D2, which corrected the hold violation. The clock frequency is set at a progressively reduced value equal to its normal specification value SPEC minus n*Δf, where n is an integer, initially 0 and Δf is a decremental value. The process repeats the steps 720, 722 and 724 with the integer n increased by one count at each iteration at 724 until there is no more timing violation. Alternatively, the iterations 722 and 724 may be omitted, the clock frequency being reduced in one step by a value n*Δf, corresponding to the delay Δt introduced by the signal delay element 212 in the data signal D2 at the output of the multiplexer 214 in response to the error signal ERR.

The invention may be implemented as a combination of hardware and software (or firmware), at least including code portions for performing steps of a method according to the invention when run on a programmable apparatus, such as a processor, digital signal processor or computer system. In the foregoing specification, the invention has been described with reference to specific examples of embodiments of the invention. It will, however, be evident that various modifications and changes may be made therein without departing from the broader spirit and scope of the invention as set forth in the appended claims. For example, the circuits described herein can be formed on any semiconductor material or combinations of materials, such as gallium arsenide, silicon germanium, silicon-on-insulator (SOI), silicon, monocrystalline silicon, the like, and combinations of the above.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The terms "assert" or "set" and "negate" (or "de-assert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Also for example, in one embodiment, the illustrated examples may be implemented as circuitry located on a single integrated circuit or within the same device. Alternatively, the examples may be implemented as any number of separate circuits or devices interconnected with each other in a suitable manner. Thus, it is to be understood that the architectures depicted herein are merely exemplary, and that in fact many other architectures can be implemented that achieve the same functionality. Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

The multiple operations may be combined into a single operation, a single operation may be distributed in additional operations and operations may be executed at least partially overlapping in time. Further, alternative embodiments may include multiple instances of a particular operation, and the order of operations may be altered in various other embodiments. However, other modifications, variations and alternatives are also possible. The specifications and drawings are, accordingly, to be regarded as illustrative rather than restrictive.

In the claims, any reference signs placed between parentheses shall not be construed as limiting the claim. The word 'comprising' does not exclude the presence of other elements or steps then those listed in a claim. Further, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

What is claimed is:

1. A digital logic circuit, comprising:
   a logic element for providing a data signal;
   a clock for providing a clock signal;
   a master-slave flip-flop including a master latch for storing data on a master latch input at a first active edge of said clock signal and a slave latch for storing data on an output of said master latch at a second active edge of said clock signal following said first active edge;
   a timing error detector module for asserting an error signal in response to a change in said data signal during a detection period following said first active edge of said clock signal; and
   a timing correction module for selectively increasing a propagation delay of said data signal from said logic element to said master latch input in response to said error signal,
   wherein said timing error detector module includes an edge detector for asserting a timing signal having a duration that defines said detection period following said first active edge of said clock signal.

2. The digital logic circuit of claim 1, wherein said timing correction module includes a signal delay element through which said data signal is arranged to pass from said logic element to said master-slave flip-flop selectively in response to said error signal.

3. The digital logic circuit of claim 1, wherein said detection period following said first active edge of said clock signal corresponds with a hold window of said master latch.

4. The digital logic circuit of claim 1, wherein said master-slave flip-flop includes a master transmission gate for receiving said data signal and transmitting said data signal to said master latch input during a phase of said clock signal preceding said first active edge, and said timing error detector module is arranged to assert said error signal in response to a difference during said detection period between said data signal received by said transmission gate and said data signal at said master latch input.

5. The digital logic circuit of claim 1, wherein said master latch includes:
   a first inverter for receiving said data on said master latch input during a phase of said clock signal preceding said first active edge, and
   a second inverter for receiving data from an output of said first inverter and applying an output signal from said second inverter to said master latch input during a phase of said clock signal following said first active edge.

6. The digital logic circuit of claim 1, wherein said timing correction module is arranged to cause said clock to reduce a frequency of said clock signal progressively in response to said error signal.

7. The digital logic circuit of claim 1, wherein said timing correction module is arranged to cause said clock to reduce a frequency of said clock signal in response to a change in said data signal during a detection period preceding said first active edge of said clock signal without increasing said propagation delay of said data signal from said logic element to said master latch input.

8. The digital logic circuit of claim 1, wherein said logic element is arranged to reset and repeat said data signal in response to said clock signal.

9. A method of detecting and correcting timing errors in a digital logic circuit including a logic element providing a data signal, a clock providing a clock signal, a master-slave flip-flop comprising a master latch for storing data on a master latch input at a first active edge of said clock signal and a slave latch for storing data on an output of said master latch at a second active edge of said clock signal following said first active edge, the method comprising:
   asserting an error signal in response to a change in said data signal during a detection period following said first active edge of said clock signal; and
   selectively increasing a propagation delay of said data signal from said logic element to said master latch input in response to said error signal,
   wherein providing said error signal includes asserting a timing signal that has a duration that defines said detection period following said first active edge of said clock signal.

10. The method of detecting and correcting timing errors of claim 9, wherein increasing said propagation delay of said data signal comprises passing said data signal from said logic element to said master-slave flip-flop selectively through a signal delay element in response to said error signal.

11. The method of detecting and correcting timing errors of claim 9, wherein said detection period following said first active edge of said clock signal corresponds with a hold window of said master latch.

12. The method of detecting and correcting timing errors of claim 9, wherein said master-slave flip-flop includes a master transmission gate for receiving said data signal and transmitting said data signal to said master latch input during a phase of said clock signal preceding said first active edge, and said error signal is asserted in response to a difference during said detection period between said data signal received by said transmission gate and said data signal at said master latch input.

13. The method of detecting and correcting timing errors of claim 9, wherein said master latch includes a first inverter receiving said data on said master latch input during a phase of said clock signal preceding said first active edge, and a second inverter receiving data from an output of said first inverter and applying an output signal from said second inverter to said master latch input during a phase of said clock signal following said first active edge.

14. The method of detecting and correcting timing errors of claim 9, wherein said clock reduces a frequency of said clock signal progressively in response to said error signal.

15. The method of detecting and correcting timing errors of claim 9, wherein said clock reduces a frequency of said clock signal in response to a change in said data signal during a detection period preceding said first active edge of said clock signal without said propagation delay of said data signal from said logic element to said master latch input increasing.

16. The method of detecting and correcting timing errors of claim 9, wherein said logic element resets and repeats said data signal in response to said clock signal.

* * * * *